United States Patent
Dhuler et al.

[19]

[11] Patent Number: 5,914,801
[45] Date of Patent: *Jun. 22, 1999

[54] MICROELECTROMECHANICAL DEVICES INCLUDING ROTATING PLATES AND RELATED METHODS

[75] Inventors: Vijayakumar R. Dhuler, Raleigh; David A. Koester, Burlington; Mark D. Walters, Durham; Karen W. Markus, Raleigh, all of N.C.

[73] Assignee: MCNC, Research Triangle Park, N.C.

[*] Notice: This patent issued on a continued prosecution application filed under 37 CFR 1.53(d), and is subject to the twenty year patent term provisions of 35 U.S.C. 154(a)(2).

[21] Appl. No.: 08/719,711

[22] Filed: Sep. 27, 1996

[51] Int. Cl.$^6$ .................................................... G02B 26/02
[52] U.S. Cl. ...................... 359/230; 359/198; 359/199; 359/224; 359/900
[58] Field of Search ................................. 359/198–199, 359/212–214, 223–224, 900, 230, 290–293; 310/36, 40 R, 40 MM

[56] References Cited

U.S. PATENT DOCUMENTS

| | | |
|---|---|---|
| 3,471,641 | 10/1969 | Baker et al. . |
| 4,073,567 | 2/1978 | Lakerveld et al. . |
| 4,230,393 | 10/1980 | Burke, Jr. . |
| 4,317,611 | 3/1982 | Peterson . |
| 4,381,672 | 5/1983 | O'Connor et al. . |
| 4,468,282 | 8/1984 | Neukermans . |
| 4,598,585 | 7/1986 | Boxenhorn . |
| 4,618,223 | 10/1986 | Fried . |
| 4,708,420 | 11/1987 | Liddiard . |
| 4,732,440 | 3/1988 | Gadhok . |
| 4,789,803 | 12/1988 | Jacobsen et al. . |
| 4,884,283 | 11/1989 | Rahn et al. . |
| 4,884,446 | 12/1989 | Ljung . |
| 5,016,072 | 5/1991 | Greiff . |
| 5,083,857 | 1/1992 | Hornbeck . |

(List continued on next page.)

FOREIGN PATENT DOCUMENTS

| | | |
|---|---|---|
| 60-107017 | 6/1985 | Japan . |
| 6-208070 | 7/1994 | Japan . |
| WO 95/03562 | 2/1995 | WIPO . |

OTHER PUBLICATIONS

Karen W. Markus, "Commercialization of Microsystems '96: The Challenges of Infrastructure—Supporting the Growth of MEMs into Production" The Engineering Foundation, pp. 28–32 (Steven Walsh ed. 1996).

Kurt Petersen et al. "Surface Micromachined Structures Fabricated with Silicon Fusion Bonding" International Conference on Solid–State Sensors and Actuators: Digest of technical Papers, 1991, pp. 397–399 (1991).

(List continued on next page.)

*Primary Examiner*—James Phan
*Attorney, Agent, or Firm*—Alston & Bird LLP

[57] ABSTRACT

An electromechanical device includes a first frame having a first aperture therein, a second frame suspended in the first frame wherein the second frame has a second aperture therein, and a plate suspended in the second aperture. A first pair of beams support the second frame along a first axis relative to the first frame so that the second frame rotates about the first axis. A second pair of beams supports the plate along a second axis relative to the second frame so that the plate rotates about the second axis relative to the frame. The first and second axes preferably intersect at a 90° angle. A first actuator provides mechanical force for rotating the second frame relative to the first frame about the first axis. A second actuator provides mechanical force for rotating the plate relative to the second frame about the second axis. Accordingly, the plate can be independently rotated relative to the first axis and the second axis. Related methods are also disclosed.

63 Claims, 10 Drawing Sheets

U.S. PATENT DOCUMENTS

| | | |
|---|---|---|
| 5,097,354 | 3/1992 | Goto . |
| 5,111,693 | 5/1992 | Greiff . |
| 5,126,812 | 6/1992 | Greiff . |
| 5,129,983 | 7/1992 | Greiff . |
| 5,172,262 | 12/1992 | Hornbeck . |
| 5,202,785 | 4/1993 | Nelson . |
| 5,203,208 | 4/1993 | Bernstein . |
| 5,212,582 | 5/1993 | Nelson . |
| 5,216,490 | 6/1993 | Greiff et al. . |
| 5,231,879 | 8/1993 | Yamamoto . |
| 5,260,596 | 11/1993 | Dunn et al. . |
| 5,331,852 | 7/1994 | Greiff et al. . |
| 5,349,855 | 9/1994 | Bernstein et al. . |
| 5,353,656 | 10/1994 | Hawkey et al. . |
| 5,392,650 | 2/1995 | O'Brien et al. . |
| 5,408,877 | 4/1995 | Greiff et al. . |
| 5,433,110 | 7/1995 | Gertz et al. . |
| 5,438,231 | 8/1995 | Khoshevisan et al. . |
| 5,450,751 | 9/1995 | Putty et al. . |
| 5,465,620 | 11/1995 | Sanderson et al. . |
| 5,488,862 | 2/1996 | Neukermans et al. . |
| 5,488,863 | 2/1996 | Mochida et al. . |
| 5,492,596 | 2/1996 | Cho . |
| 5,496,436 | 3/1996 | Bernstein et al. . |
| 5,507,911 | 4/1996 | Greiff . |
| 5,515,724 | 5/1996 | Greiff et al. . |
| 5,530,342 | 6/1996 | Murphy . |
| 5,535,902 | 7/1996 | Greiff . |
| 5,606,447 | 2/1997 | Asada et al. ............................ 359/199 |
| 5,616,864 | 4/1997 | Johnson et al. . |
| 5,629,790 | 5/1997 | Neukermans et al. . |
| 5,635,638 | 6/1997 | Geen . |
| 5,635,639 | 6/1997 | Greiff et al. . |
| 5,635,640 | 6/1997 | Geen . |
| 5,635,739 | 6/1997 | Greiff et al. . |
| 5,646,348 | 7/1997 | Greiff et al. . |
| 5,650,568 | 7/1997 | Greiff et al. . |
| 5,652,374 | 7/1997 | Chia et al. . |
| 5,656,777 | 8/1997 | Petri et al. . |
| 5,656,778 | 8/1997 | Roszhart . |
| 5,673,139 | 9/1997 | Johnson . |

OTHER PUBLICATIONS

B. Diem et al., "SOI (Simox) and Substrate for Surface Micromachining of Single Crystalline Silicon Sensors and Actuators" The 7th International Conference on Solid–State Sensors and Actuators, pp. 233–236. (1994).

B. Wagner, et al., "Electromagnetic Microactuators with Multiple Degrees of Freedom" Fraunhofer–Institut fur Mikrostrukturtechnik, 1991IEEE, 91CH2817–5/91 10000–0614 pp. 614–617 (1991).

V.P. Jaecklin et al., "Mechanical and Optical Properties of Surface Micromachined Torsional Mirrors in Silicon, Polysilicon and Aluminum" The 7th International Conference on Solid–State Actuators pp. 958–61 (1994).

Kurt E. Petersen, "Silicon as a Mechanical Material," Proceedings of the IEEE, vol., 70, No. 5, May 1982, pp. 420–457.

R.A. Buser et al., "Very High Q–factor Resonators in Monocrystalline Silicon," Sensors and Actuators, A21–A23 (1990) pp. 323–327.

R.N. Kleiman, et al. "Single–crystal Silicon High–Q Torsional Oscillators," Rev. Sci. Instrum. 56(11), pp. 2088–2091 (American Institute of Phisics Nov. 1985).

W.G. Pfann et al., "Semiconducting Stress Transducers Utilizing the Transverse and Shear Piezoresistance Effects," The Journal of Applied Physics, vol. 32, No. 10, Oct. 1961, pp. 2008–2019.

Karen w. Markus, "Fabrication Technology and the Challenges of Large–Scale Production," Frontiers of Engineering: Reports on Leading Edge Engineering From the 1996 NAE Symposium on Frontiers of Engineering, p. 57, National Academy of Engineering, 1996.

Karen W. Markus, "Developing Infrastructure to Mass–Produce MEMS" Computational Science & Engineering, Jan.–Mar. 1997 pp. 49–54.

Karen W. Markus et al., "MEMS Infrastructure: Multi–User Access and Smart MEMS," Government Microcircuit Applications Conference 1994, 1994 Digest of Papers pp. 207–210.

Bernhard E. Boser et al., "Design of Integrated MEMs," Emerging Technologies, Designing Low Power Digital Systems, Tutorial for 1996 International Symposium on Circuits and Systems, Ch. 3.1, pp. 207–32.

K.W. Markus et al., "Smart MEMS: Flip Chip Integration of MEMS and Electronics," Smart Structures and Materials 1995—Smart Electronics, proceedings of SPIE The International Society for Optical Engineering, vol. 2448, pp. 82–92 (Varadan ed. Mar. 2–3, 1995).

J.A. Walker et al., A Silicon Modulator With 5MHz Operation for Fiber–In–The–Loop Applications, The 8th International Conference on Solid–State Sensors and Actuators, Eurosensors IX, pp. 285–288 (1995).

John H. Comtois et al., "Surface Micromachined Polysilicon Thermal Actuator Arrays and Applications," Solid–State Sensors and Actuators Workshop pp. 174–177 (Transducers Research Foundation, Inc., eds. Jun. 3–6, 1996).

Kurt Petersen, et al., "Surface Micromachined Structures Fabricated with Silicon Fusion Bonding," Tranducers '91— 1991 International Conference on Solid–State Sensors and Actuators, Digest of technical Papers, pp. 397–399.

K. Deng et al., The Development of Polysilicon Micromotors for Optical Scanning Applications, Proceeding, IEEE Solid–State Sensor and Actuator Workshop, Hilton Head Island, SC, Jun. 1994.

V.P. Jaecklin et al., Optical Microshutters and Torsional Micromirrors For Light Modulator Arrays,l IEEE, 1993, pp. 124–127.

Yoshinori Ohtuka et al., 2–Dimensional Optical Scanner Applying A Torsional Resonator With 2 Degrees Of Freedom, Proceedings, IEEE Micro Electro Mechanical Systems, 1995, pp. 306–309.

Kurt E. Petersen, Silicon Torsional Scanning Mirror, IBM J.Res.Develop., vol. 24, No. 5, Sep. 1980, pp. 631–637.

U. Breng et al., Electrostatic Micromechanic Actuators, J. Micromech. And Microeng., vol. 2, 1992, pp. 256–261 (No Month).

MICROELECTROMECHANICAL DEVICES INCLUDING ROTATING PLATES AND RELATED METHODS

FIELD OF THE INVENTION

The present invention relates to the field of electromechanics and more particularly to the field of microelectromechanical devices.

BACKGROUND OF THE INVENTION

Thin film processes developed in the field of microelectronic integrated circuits have been used to produce precision microelectromechanical devices. For example, solid state laser and fiber optic couplings, ink jet nozzles and charge plates, magnetic disk read/write heads, and optical recording heads have been produced using thin film processes including photolithography, sputter deposition, etching, and plasma processing. These thin film processes allow the production of microelectromechanical devices with submicron dimensional control.

One important microelectromechanical device is an electrostatically driven rotating mirror which is used in an optical scanner such as a bar code reader. In particular, an electrostatically driven torsional scanning mirror is discussed in the reference entitled "Silicon Torsional Scanning Mirror" by Kurt E. Petersen, IBM J.Res.Develop., Vol. 24, No. 5, September 1980. In this reference, a single-crystal silicon chip contains a mirror element attached to two single-crystal silicon torsion bars. This silicon chip is bonded to another substrate into which a shallow rectangular well has been etched. At the bottom of the well, two electrodes are alternately energized to deflect the mirror element in a torsional movement about the silicon torsion bars.

The silicon torsion bars, however, may be unnecessarily stiff thus requiring excessive torque to rotate the mirror. In addition, the location of the electrodes in the path of the rotating mirror may restrict the rotation of the mirror. Increasing the distance between the electrodes and the mirror may reduce the electrostatic force generated therebetween. Furthermore, the bonding of the silicon chip to the second substrate may add unnecessary complication to the fabrication of the device.

A two-dimensional optical scanner is discussed in the reference entitled "2-Dimensional Optical Scanner Applying a Torsional Resonator With 2 Degrees of Freedom" by Yoshinori Ohtuka et al., Proceedings, IEEE Micro Electro Mechanical Systems, 1995, pp. 418, 306–309. This reference discusses a torsional vibration system where two vibration forces are produced by one driving circuit. In particular, bimorph cells are used to excite the torsional vibration. One-dimensional scanning is enabled by driving the bimorph cells with the resonance frequency of either of the two torsional vibrations. Two-dimensional scanning can be achieved if the bimorph cells are operated by adding the resonance frequency signals of the two torsional vibrations. The scanner of this reference, however, may only be able to independently scan in any one dimension at predetermined resonance frequencies. In other words, because a single driving circuit is used to excite vibration about two axes, vibration about either axis may be limited to predetermined resonance frequencies. The scanner of this reference may also require the assembly of discrete components.

Notwithstanding the above mentioned references, there continues to exist a need in the art for improved microelectromechanical scanners and methods.

SUMMARY OF THE INVENTION

It is therefore an object of the present invention to provide improved electromechanical devices and methods.

It is another object of the present invention to provide an electromechanical rotating plate including improved actuators.

It is still another object of the present invention to provide an electromechanical rotating plate which can reduce the torque needed to effect rotation.

It is still another object of the present invention to provide an electromechanical rotating plate which can independently rotate around two different axes.

These and other objects are provided according to the present invention by electromechanical devices including a frame having an aperture therein and a plate suspended in the aperture. A pair of beams extend from opposite sides of the plate to the frame wherein a first end of each of the beams is fixedly connected to one of the plate and the frame and the second end of each of the beams is in rotational contact with the other of the plate and the frame so that the plate rotates relative to the second frame about an axis defined by the beams. Accordingly, the plate is free to rotate about the axis thus requiring relatively little torque to effect rotation.

Furthermore, the electromechanical devices can include an actuator having an electrode spaced apart from the frame and an arm extending from the electrode to a portion of the plate so that a potential difference between the electrode and the frame results in an electrostatic force which is transmitted by the arm to the plate thus effecting rotation of the plate. Because this actuator generates an electrostatic force in response to a potential difference between itself and the frame instead of the plate, the actuator does not inhibit motion of the plate. In addition, this actuator can provide a biasing support for the plate.

According to one aspect of the present invention, an electromechanical device includes a first frame having a first aperture therein, a second frame suspended in the first aperture wherein the second frame has a second aperture therein, and a plate suspended in the second aperture. A first pair of beams support the second frame along a first axis so that the second frame rotates about the first axis. A second pair of beams support the plate along a second axis so that the plate rotates about the second axis. The first axis and the second axis preferably intersect at a 90° angle providing independent rotation for the plate about both axes. A first actuator provides mechanical force for rotating the second frame relative to the first frame about the first axis. A second actuator provides mechanical force for rotating the plate relative to the second frame about the second axis. Accordingly, the plate can be independently rotated relative to the first and second axes.

The first and second frames can be formed from a microelectronic substrate to provide a microelectromechanical actuator. The plate can also be formed from this microelectronic substrate. Accordingly, the two axis actuator can be fabricated on a single substrate without the need for wafer bonding. More particularly, the first and second frames and the plate can be formed from a silicon substrate and the beams can be formed from polysilicon. The microelectromechanical actuator can thus be fabricated using thin film processing techniques known in the field of micromachining.

Each of the beams supporting the plate can extend from an opposite side of the plate to the second frame, and a first end of each of the beams can be fixedly connected to one of the plate or the second frame. The second end of each of the beams can be in rotational contact with the other of the plate or the second frame so that the plate rotates relative to the second frame about the axis defined by the beams. More particularly, these beams can be fixedly connected to the plate, and each beam may include an arched contact surface adjacent the second frame so that each of the beams rolls on the second frame as the plate rotates. The arched contact surfaces further reduce the torque required to rotate the plate.

A biasing support can support the plate relative to the second frame so that the plate and the second frame are coplanar when no mechanical force is provided by the second actuator and so that the plate rotates about the second axis when mechanical force is provided by the second actuator. This biasing support can be provided by the actuator. In particular, the second actuator can include an electrode spaced apart from the second frame and an arm extending from the electrode to a portion of the plate wherein a potential difference between the electrode and the second frame results in electrostatic force which is transmitted via the arm to the plate thus rotating the plate relative to the second frame. The electrode can be fixedly connected to the second frame along a portion thereof spaced from the plate, and the arm can be fixedly connected to the plate so that the plate and the second frame are maintained in a common plane when there is no potential difference between the electrode and the second frame. Alternately, a micromechanical spring can be provided between the plate and the second frame.

An insulating layer can be provided between the second frame and the electrode of the second actuator to prevent electrical shorts therebetween. For example, a silicon nitride layer can be provided on the second frame. In addition, the arm of the actuator may extend to a portion of the plate closely spaced from the second axis. Accordingly, a relatively small movement of the actuator can result in a relatively large rotation of the plate about the second axis.

According to another aspect of the present invention, a method for fabricating an electromechanical device on a substrate includes the steps of defining plate and frame regions on a face of the substrate wherein the frame region surrounds the plate region and wherein the plate region and the frame region are separated by a sacrificial substrate region. A supporting structure is formed to support the plate region along an axis relative to the frame region, and an actuator is formed on the face of the substrate which provides mechanical force to the plate region. The sacrificial substrate region is then removed so that the plate region rotates about the axis relative to the frame region in response to mechanical force provided by the actuator. This method allows the fabrication of a microelectromechanical device with a rotating plate using a single substrate thus eliminating the need for wafer bonding.

More particularly, the steps of defining the plate and frame regions may include doping the respective regions, and the step of removing the sacrificial substrate region may include etching undoped portions of the substrate. Accordingly, the plate and frame regions can be defined early in the fabrication process and then separated later in the fabrication process after forming the beams and the actuators. Accordingly, the plate and frame regions can be defined without creating significant topography allowing the beams and actuators to be formed on a relatively flat substrate.

The step of forming the supporting structure can include the steps of forming a pair of beams on opposite sides of the plate region which define an axis of rotation through the plate region. Each of the beams extends from the plate region to the frame region, and each of the beams is fixedly connected to one of the plate region and the frame region. A second end of each of the beams is in rotational contact with the other of the plate region and the frame region so that the plate rotates relative to the frame. As discussed above, the rotational contact reduces the torque required to rotate the plate.

The step of forming the beams can include the steps of forming a sacrificial layer on the substrate, forming first and second holes in the sacrificial layer exposing portions of the plate region along the axis, and forming first and second partial holes in the sacrificial layer opposite the frame region without exposing the frame region. The partial holes are formed along the axis, and the partial holes can be formed by isotropically etching the sacrificial layer. First and second beams are formed on the sacrificial layer wherein each of the beams is fixedly connected to the plate region through a respective one of the holes in the sacrificial layer. Each beam extends from a respective exposed portion of the plate region to a respective partial hole opposite the frame region. The sacrificial layer is then removed so that the first and second beams extend from the plate to the frame in a cantilevered fashion. Accordingly, each of the beams includes an arched contact surface in rotational contact with the frame.

The step of forming the sacrificial layer may include the steps of forming a first sacrificial sublayer having a first etch rate and forming a second sacrificial sublayer having a second etch rate which is high relative to the first etch rate. The step of isotropically etching the sacrificial layer thus forms the partial holes primarily in the second sacrificial sublayer. The first sacrificial sublayer with the relatively low etching rate thus ensures an adequate spacing between the contact surface of the beam and the substrate.

The step of forming the actuator can include the steps of forming an electrode spaced apart from the frame region and an arm extending from the electrode to a portion of the plate region. A potential difference between the electrode and the frame region results in electrostatic force which is transmitted by the arm to the plate region. Accordingly, the plate can rotate in response to the electrostatic force generated between the electrode and the frame. Furthermore, by providing a fixed connection between the arm and the plate, the actuator can provide a biasing support which supports the plate relative to the frame so that the plate and the frame are coplanar when no mechanical force is provided to the plate.

Electromechanical devices of the present invention can thus provide independent rotation of the plate about two axes of rotation. The beams which provide a rotational contact between the plate and the frame can reduce the torque required to rotate the plate. Furthermore, the electrostatic actuators which generate a mechanical force in response to a potential difference between the electrode and the frame need not lie in the path of rotation of the plate. Electromechanical devices of the present invention can also be fabricated on a single substrate using micromachining techniques.

By providing a reflecting surface on the plate, a rotating mirror for a scanner can be produced. Accordingly, a rotating mirror can be produced efficiently and economically without the need for wafer bonding or the assembly of discrete components.

DETAILED DESCRIPTION

Figure 1A:
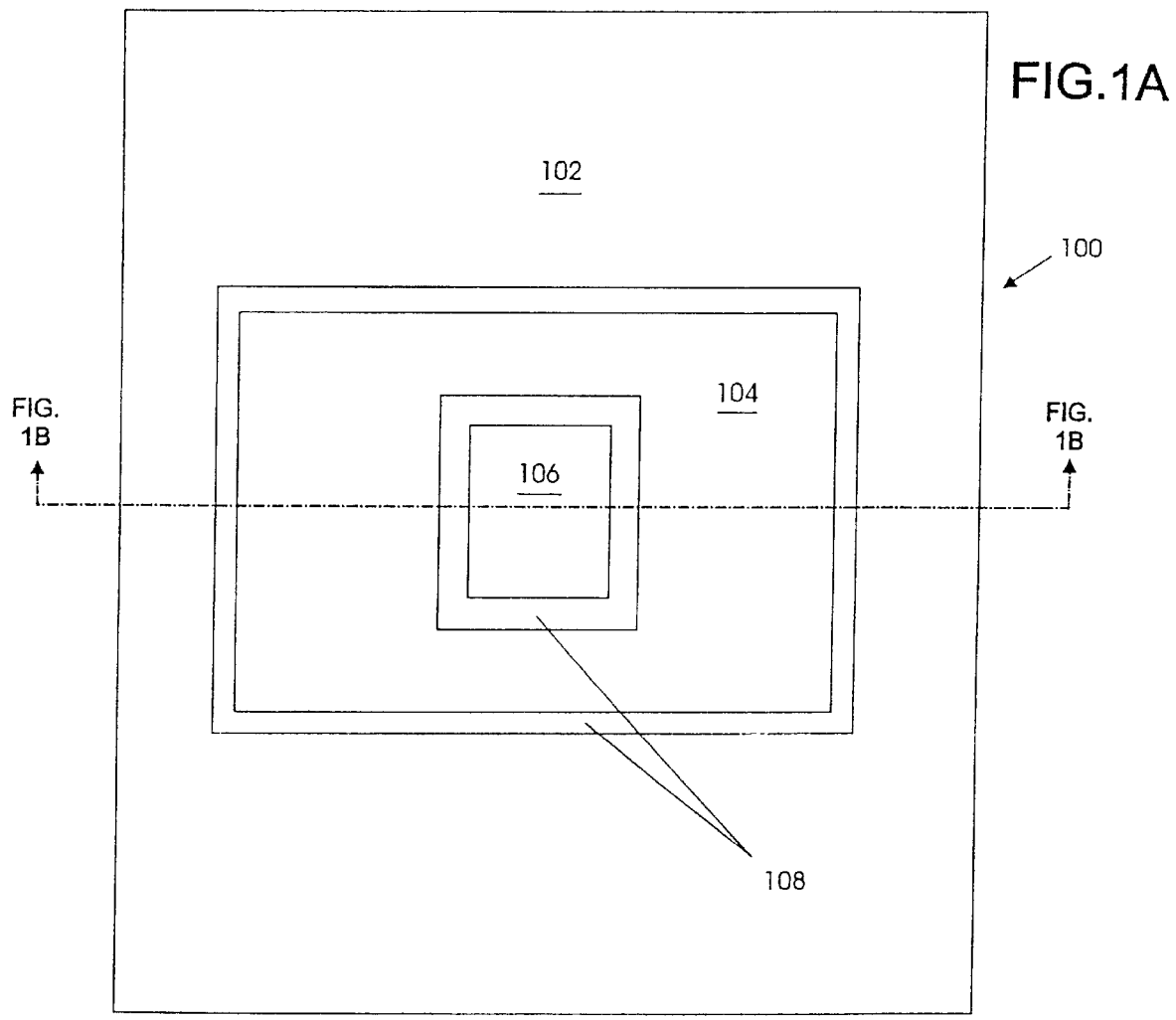
FIG. 1A is a plan view of a substrate with doped regions defining first and second frame regions and a plate region according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 5A:
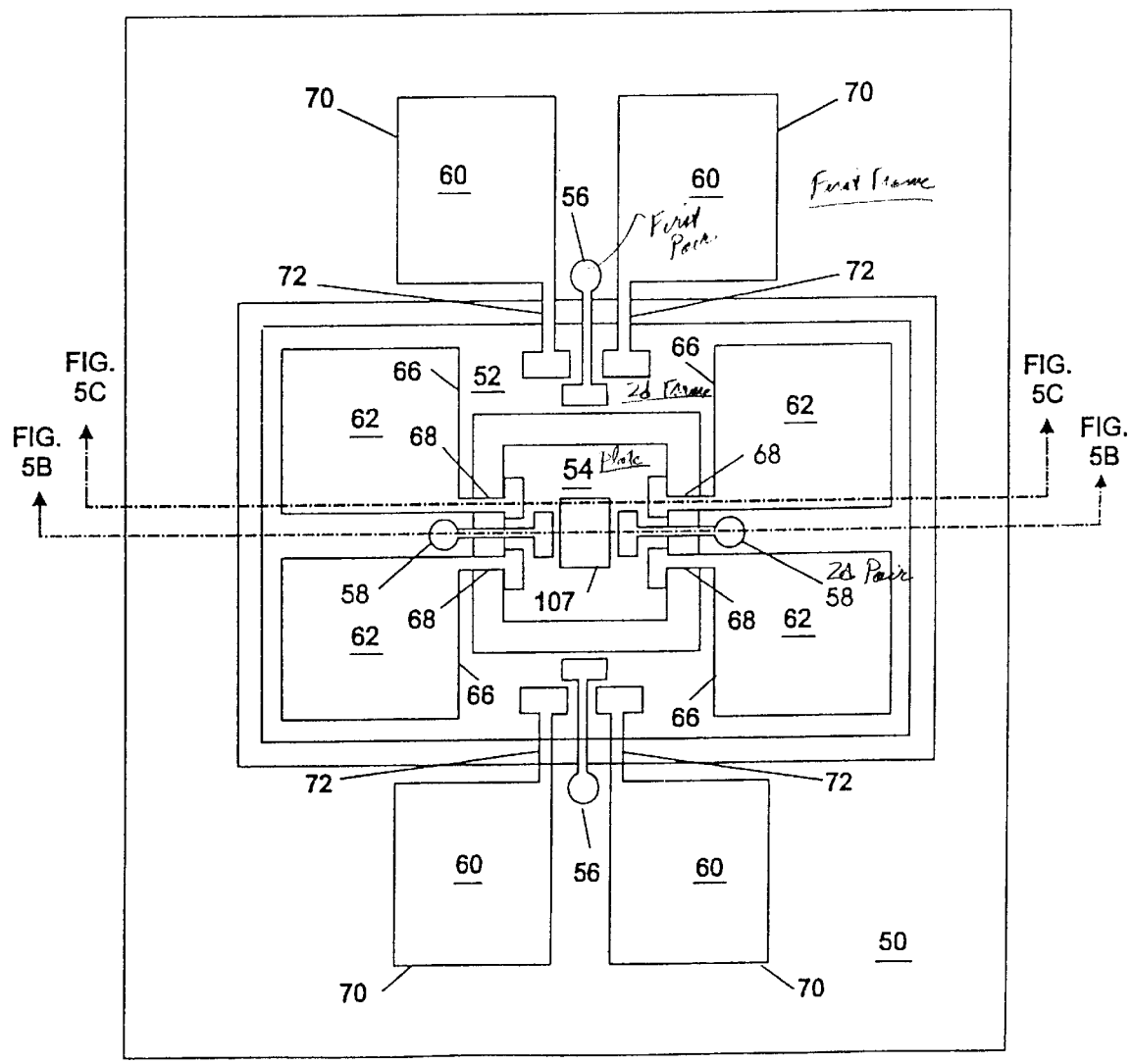
FIG. 5A is a plan view of the substrate of FIG. 4A after removing the sacrificial layers and sacrificial portions of the substrate.
Figure 5B:
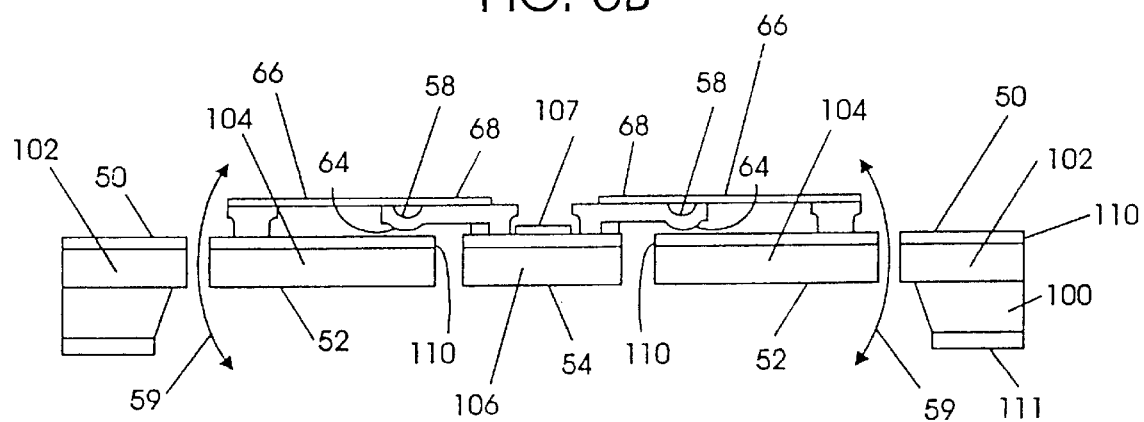
FIG. 5B is a cross sectional view of the substrate of FIG. 5A taken along the section line labeled FIG. 5B.
Figure 5C:
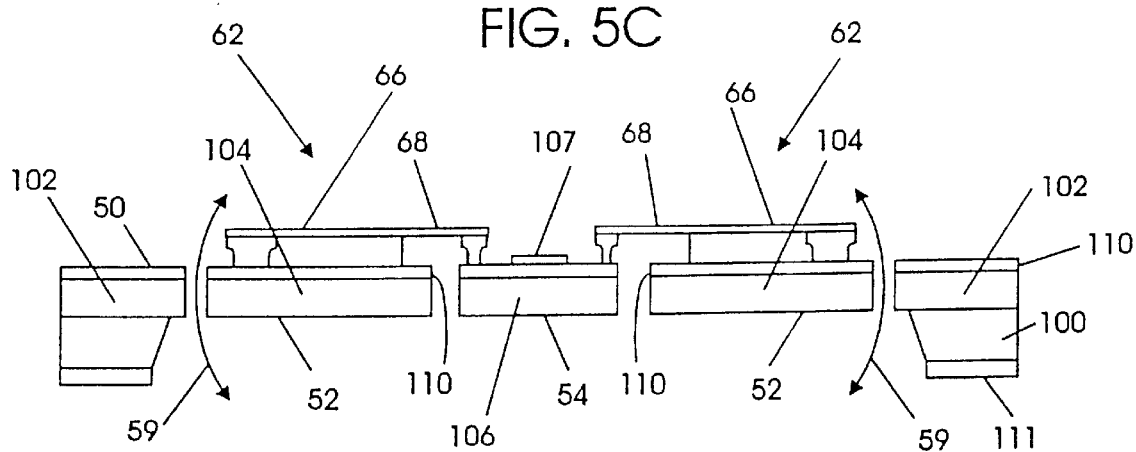
FIG. 5C is a cross sectional view of the substrate of FIG. 5A taken along the section line labeled FIG. 5C.

A top view of a microelectromechanical rotating mirror according to the present invention is illustrated in FIG. 5A, while cross sectional views are illustrated in FIGS. 5B and 5C. In particular, a first frame 50 and a second frame 52 respectively surround the rotating plate 54 on which a mirror can be formed. A first pair of beams 56 support the second frame 52 along a first axis relative to the first frame 50 so that the second frame 52 rotates about the first axis relative to the first frame 50. A second pair of beams 58 supports the plate 54 along a second axis relative to the second frame 52 so that the plate 54 rotates about the second axis relative to the second frame 52. As shown, the first axis of rotation and the second axis of rotation intersect at a 90° angle.

A first set of four actuators 60 is provided on the first frame 50 with one actuator on each side of each of the beams 56 of the first pair. These actuators 60 provide mechanical force for rotating the second frame 52 relative to the first frame 50 about the first axis which is defined by the first pair of beams 56. A second set of four actuators 62 is provided on the second frame 52 with one actuator on each side of each of the beams 58 of the second pair. These actuators 62 provide mechanical force for rotating the plate 54 relative to the second frame 52 about the second axis which is defined by the second pair of beams 58. In addition, both sets of actuators assist in positioning and supporting the movable plate and second frame. Accordingly, the plate can rotate independently about both the first axis of rotation and the second axis of rotation.

As shown in cross section in FIG. 5B, each of the beams 58 of the second pair extends from a side of the plate 54 and is fixedly connected thereto. Each beam 58 extends over the second frame 52 and is positioned adjacent the surface thereof for rotational movement. Accordingly, these beams 58 define the second axis of rotation about which the plate 54 rotates relative to the second frame 52. Because the beams 58 are not fixedly connected to both the plate 54 and the second frame 52, the torque required to rotate the plate about the second axis can be reduced. Furthermore, the arched contact surface 64 of each beam 58 adjacent the second frame 52 allows the beam to roll on the second frame during rotation of the plate 54 further reducing the torque required to rotate the plate.

As will be understood by one having skill in the art, the arched contact surface 64 can be rounded, pointed, or otherwise shaped to provide a rolling motion for the beam when the plate rotates. In addition, the pair of second beams extending from opposite sides of the plate is defined to include a structure wherein the pair of beams are joined on the plate. In other words, the pair of second beams can be provided by a structure on the plate which extends across the plate and beyond opposite sides of the plate. The pair of first beams can be provided by a similar structure on the second frame raised to permit movement of the plate. Alternately, the pair of second beams and the plate can be formed from a single layer of a material such as polysilicon so that the pair of second beams and the plate are confined within a single plane. Again, the pair of first beams and the second frame can similarly be formed from a single layer. The beams 56 extending from the second frame 52 operate in the same manner as discussed above with regard to the beams 58 extending from the plate 54.

As shown in FIG. 5C, each of the actuators 62 includes at least one electrode 66 spaced apart from and electrically insulated from the second frame 52, and an arm 68 extending from the electrode 66 and attached to a portion of the plate 54 off the second axis. The electrode is an electrically conductive plate generally parallel to the second frame and spaced from it by supports, as illustrated in FIGS. 5B and 5C. The supports are preferably located at the edge of the electrode and are located on two sides, but this configuration may change as necessary or desirable to obtain the optimum combination of structural support and flexibility for movement.

Accordingly, a potential difference between the electrode 66 and the second frame 52 will result in an electrostatic force which is transmitted via the arm 68 to the plate 54 thus rotating the plate 54 relative to the second frame 52. By attaching the arm 68 to the plate 54, the plate 54 and the second frame 52 can be maintained in a generally common plane when there is no potential difference between the electrode 66 and the second frame 52. The actuator 62 can thus provide a structure that supports the plate 54 relative to the second frame 52 and selectively biases it to induce desired rotation. Such biasing support can alternately be provided by micromachined springs which can be formed from the same material used to form the plate and the second frame. For example, serpentine springs may be formed between the plate and frame.

The rotation of the second frame 52 is illustrated by arrows 59 in FIGS. 5B and 5C. This rotation occurs in the plane of FIGS. 5B and 5C about the axis defined by the first pair of beams 56 (shown in FIG. 5A). The plate 54 rotates into and out of the plane of FIGS. 5B and 5C about the axis defined by the second pair of beams 58.

By generating a potential difference between the electrode 66 and the second frame 52 at a location remote from the plate or its rotational arc, the electrode does not interfere with or intrude into the path of rotation of the plate 54. Accordingly, the electrode 66 can be closely spaced from the second frame 52 thus increasing the electrostatic force generated without reducing a range of motion for the plate 54. Furthermore, the useful size of the electrode 62 and the electrostatic forces generated thereby are not limited by the size of the plate 54.

The arm 68 preferably extends to a portion of the plate 54 closely spaced from the second axis. Accordingly, a relatively small displacement of the arm 68 can result in a relatively large rotation of the plate 54. As shown, the actuator arms 68 are fixedly connected to the plate 54 thus providing biasing support for the plate. Alternatively, the arms can extend adjacent to the plate without being fixedly connected thereto. Accordingly, the torque required to rotate the plate can be reduced because the arms are positioned adjacent the surface of the plate but are not attached to it. The insulating layer 110 forming the upper surface of the second frame can be used to prevent electrical shorts between the electrode 62 and the conductive portion of the second frame 52. The actuators 60 on the first frame including electrodes 70 and the arms 72 operate as discussed above with regard to the actuators 62 on the second frame.

Figure 6:
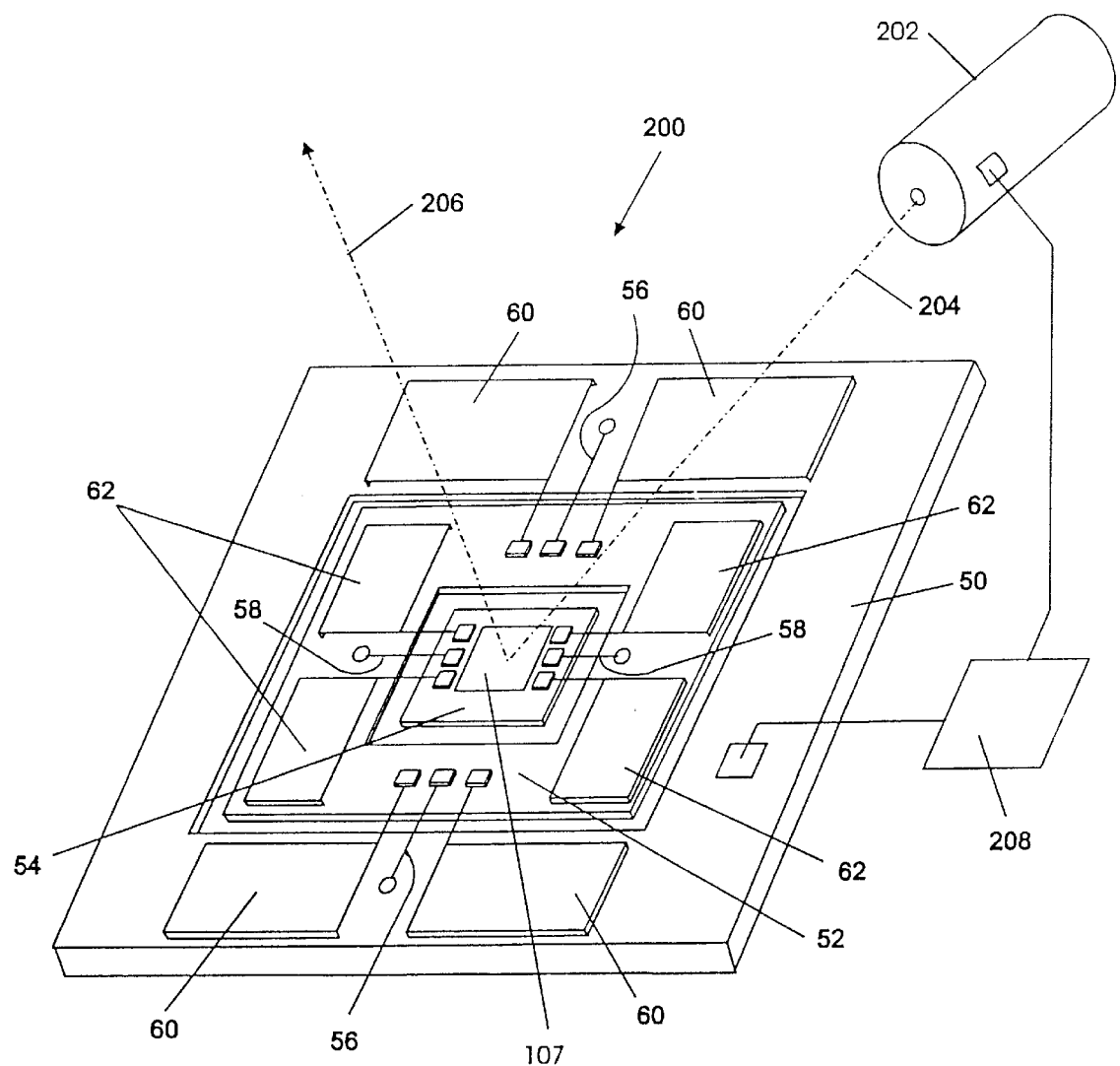
FIG. 6 is a perspective view of an optical scanner according to the present invention.

By providing a reflective surface 107 on the plate, a rotating mirror is produced. This rotating mirror can be used to provide an optical scanner 200 such as a bar code reader, as shown in FIG. 6. For example, a laser 202 or other energy source can generate a beam of electromagnetic radiation 204 such as light and project the beam onto the reflective surface 107 of the rotating mirror. By rotating the mirror about the first and second axes, the reflected beam 206 can be scanned in a predetermined pattern. This scanned beam can be used to read a pattern such as a bar code. The control circuit 208 may provide control signals which control the operation of the rotating mirror and the operation of the laser.

Figure 1B:
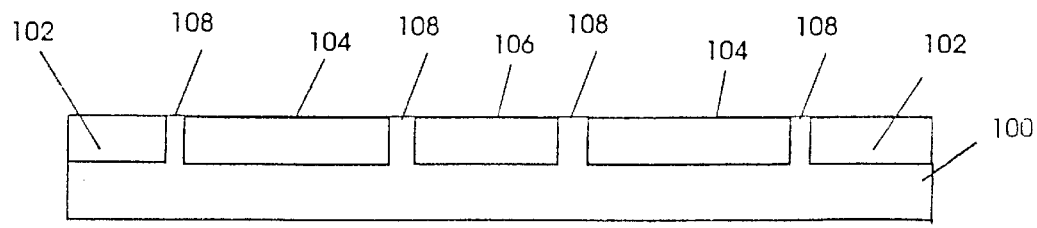
FIG. 1B is a cross sectional view of the substrate of FIG. 1A taken along the section line labeled FIG. 1B.

A method for fabricating the microelectromechanical rotating mirror of FIGS. 5A–C will be discussed as follows with reference to FIGS. 1A–C, 2A–C, 3A–C, 4A–C, and 5A–C. As shown in FIGS. 1A–C, predetermined surface regions of substrate 100 are doped thus defining the first frame region 102, the second frame region 104, and the plate region 106. The substrate can be a microelectronic substrate formed from materials such as silicon, gallium arsenide, or other materials used in the fabrication of microelectronic devices. The predetermined surface regions can be doped with boron by either an implant or a diffusion step. Each of these regions is separated by sacrificial substrate regions 108. The dopant can later serve as an etch stop so that the sacrificial regions of the substrate can be selectively etched away leaving only doped portions of the substrate. Such an etch can be performed at a later point in fabrication to separate the first frame 50, the second frame 52, and the plate 54 as shown in FIGS. 5A–C. Accordingly, the frame and plate regions can be defined without creating significant topology which could increase the difficulty of processing.

Figure 2A:
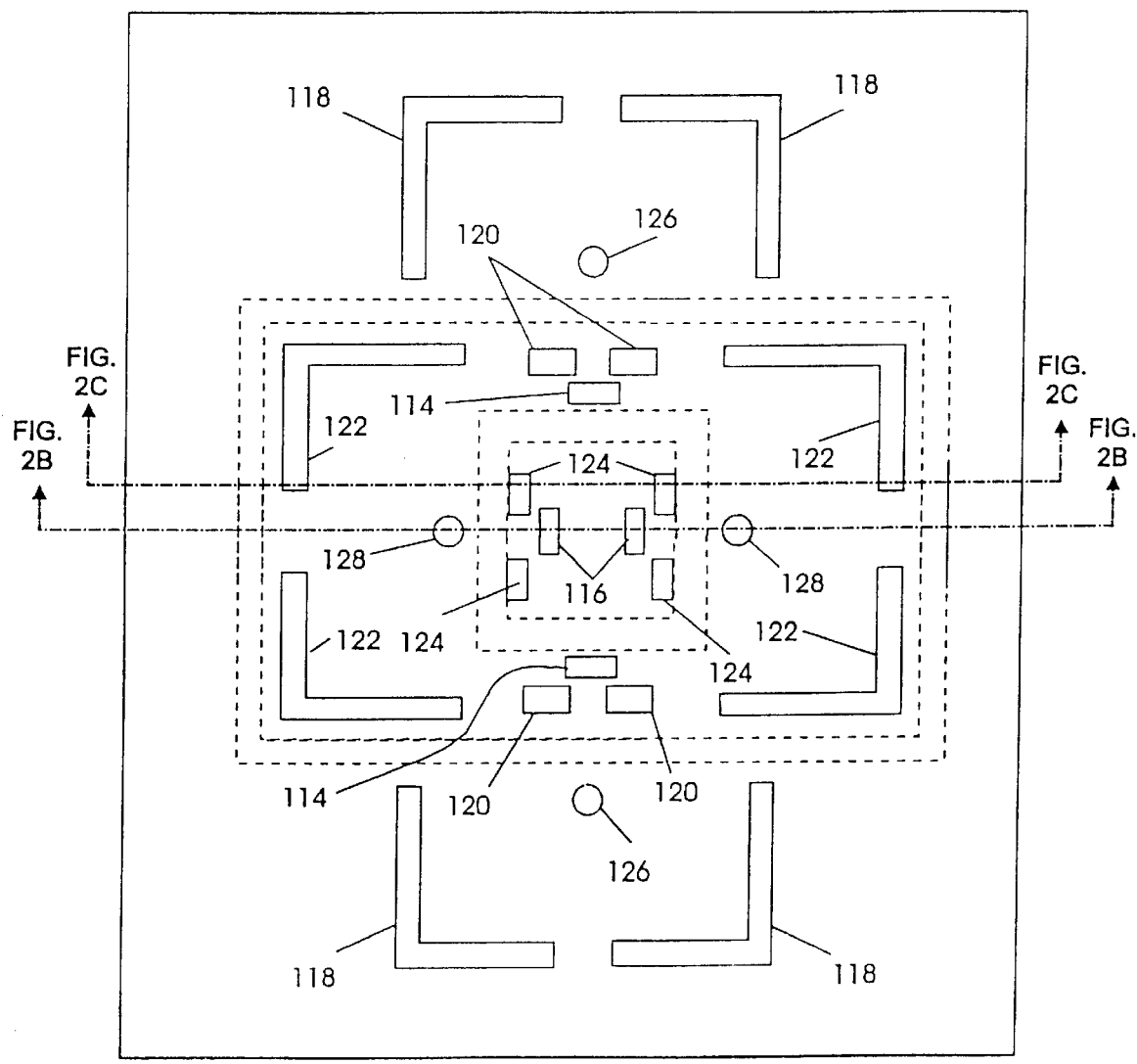
FIG. 2A is a plan view of the substrate of FIG. 1A covered with a patterned sacrificial layer.
Figure 2B:
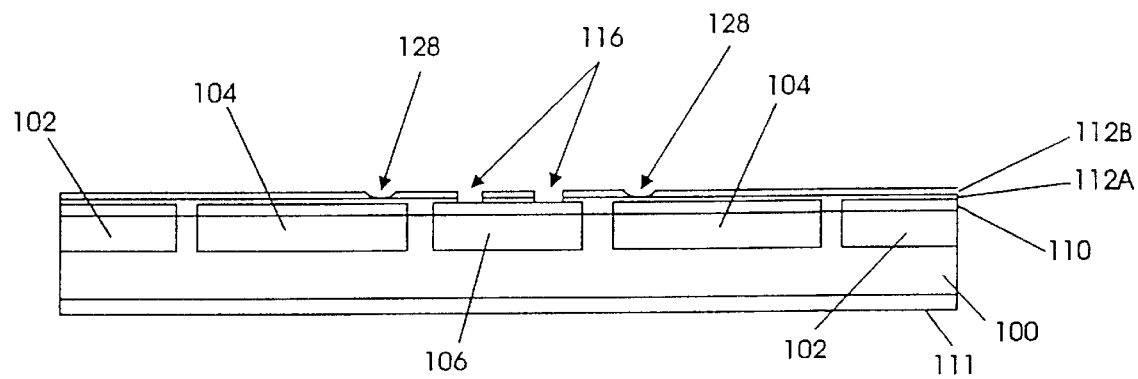
FIG. 2B is a cross sectional view of the substrate and sacrificial layer of FIG. 2A taken along the section line labeled FIG. 2B.
Figure 2C:
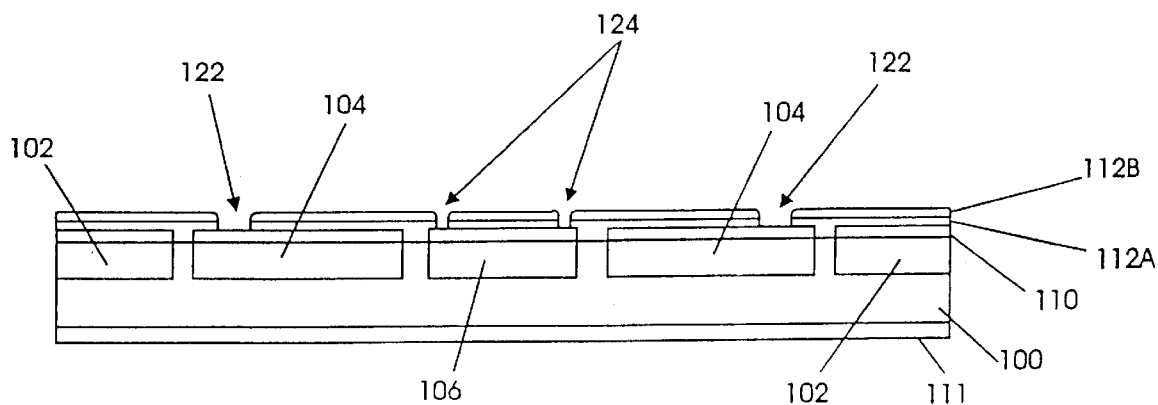
FIG. 2C is a cross sectional view of the substrate and sacrificial layer of FIG. 2A taken along the section line labeled FIG. 2C.

A protective nitride layer 110 can be formed on the doped regions of the substrate, and a sacrificial layer 112 can then be formed on the substrate and patterned, as shown in FIGS. 2A–C. The nitride layer 110 can provide stress compensation in the frame and plate regions when separated, and the nitride layer 110 can also provide an insulating layer between the electrodes and respective frames. The nitride layer 110 can also provide insulation between conductive lines and the doped regions of the substrate. Alternately, the nitride layer 110 can cover only portions of the doped regions as required. For example, portions of the plate could be left uncovered using the reflective properties of the substrate to provide the mirror. A protective nitride layer 111 can also be formed on the back of the substrate 100. The nitride layers 110 and 111 can be formed simultaneously.

Partial holes 126 in the sacrificial layer provide a mold for the arched contact surfaces for each of the first pair of beams, and the partial holes 128 provide a mold for the arched contact surfaces for each of the second pair of beams. The partial holes 126 and 128 can be formed simultaneously by isotropically etching partial holes through the sacrificial layer 112 without exposing the substrate. The isotropic etch provides the arched surfaces shown in FIG. 2B. In particular, small portions of the sacrificial layer 112 are exposed photolithographically, and a wet isotropic etch is performed for a predetermined time so that the partial hole is formed with the arched surface and without exposing the substrate.

The sacrificial layer 112 can include a first sacrificial sublayer 112A having a first etch rate and a second sacrificial sublayer 112B having a second etch rate which is high relative to the first etch rate. Accordingly, the partial hole is formed primarily in the second sacrificial sublayer 112B with the first sacrificial sublayer 112A being used to prevent the substrate from being exposed. In particular, the first sacrificial sublayer 112A can be formed from a thermal silicon oxide, and the second sacrificial sublayer 112B can be formed from phosphorus silicate glass (PSG) which has an etch rate that is high when compared to that of a thermal silicon oxide. Accordingly, a portion of the sacrificial layer remains between the arched surface of the partial holes and the substrate. Dashed lines in FIG. 2A indicate the frame and plate regions of the substrate which have been previously defined and covered with the sacrificial layer 112.

The sacrificial layer 112 can then be patterned to expose portions of the substrate to which the actuators and supporting beams will be anchored. The holes 114 expose portions of the substrate to which the first pair of beams will be anchored to the second frame. The holes 116 expose portions of the substrate to which the second pair of beams will be anchored to the plate. The holes 118 expose portions of the substrate to which the first set of actuator electrodes will be anchored to the first frame, and the holes 120 expose portions of the substrate to which the first set of actuator arms will be anchored to the second frame. The holes 122 expose portions of the substrate to which the second set of actuator electrodes will be anchored to the second frame, and holes 124 expose portions of the substrate to which the second set of actuator arms will be anchored to the plate. Preferably, the step of forming the partial holes 126 and 128 precedes the step of forming the holes 114, 116, 118, 120, 122, and 124 which expose the substrate because higher resolution patterning may be required to form the partial holes.

As shown, the actuator electrodes can be anchored to the substrate along L shaped patterns 118 and 122 as shown in FIG. 2A. Alternately, the actuator electrodes can be anchored to smaller portions of the substrate such as patterns including only the linear portion of the L perpendicular to the respective axis of rotation. The larger L shaped anchor may provide a stiffer actuator capable of providing lower force at a higher frequency of operation, while the smaller linear anchor may provide a more flexible actuator capable of providing greater force at a lower frequency of operation.

Figure 3A:
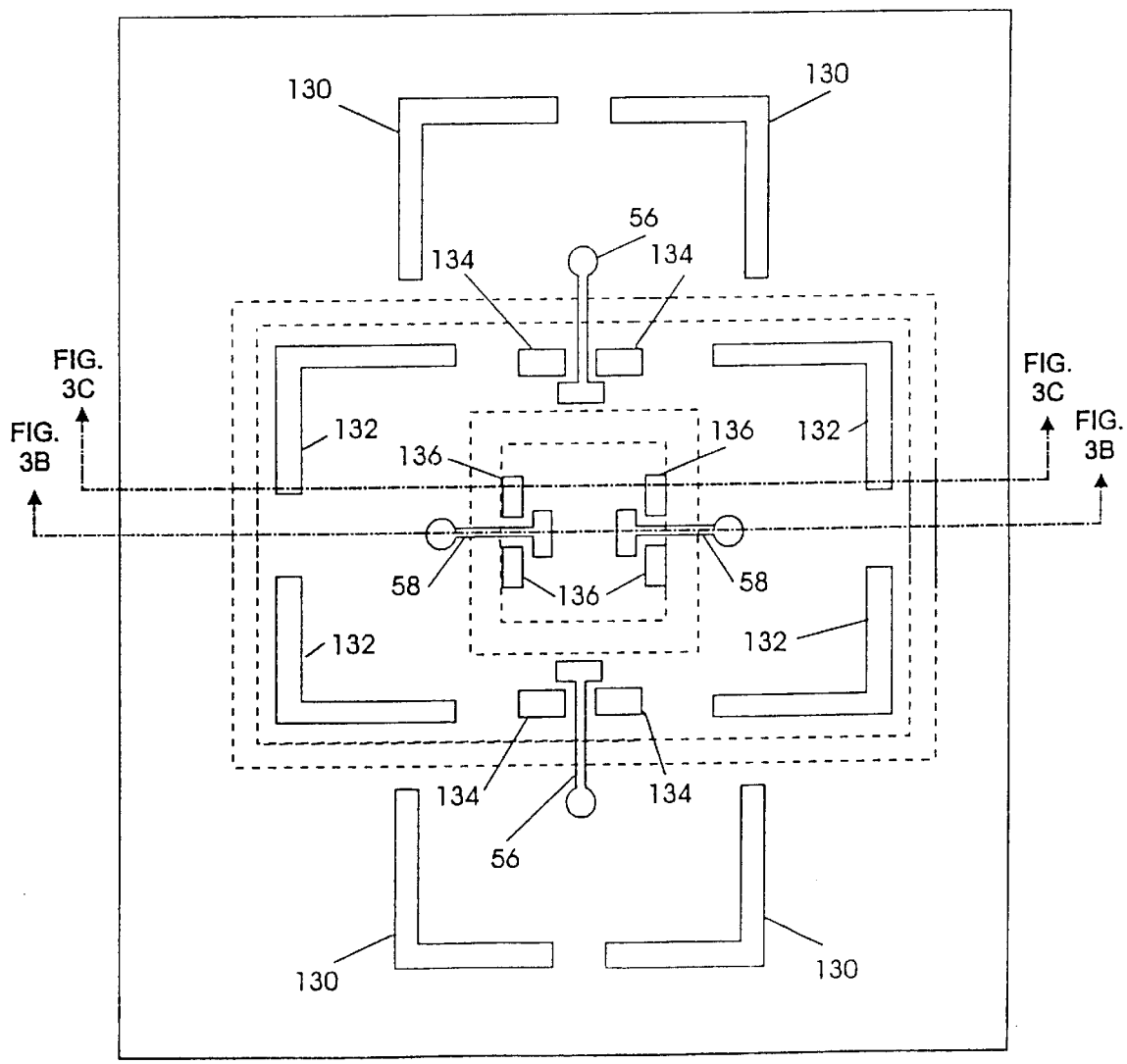
FIG. 3A is a plan view of the substrate and sacrificial layer of FIG. 2A with supporting beams formed thereon.
Figure 3B:
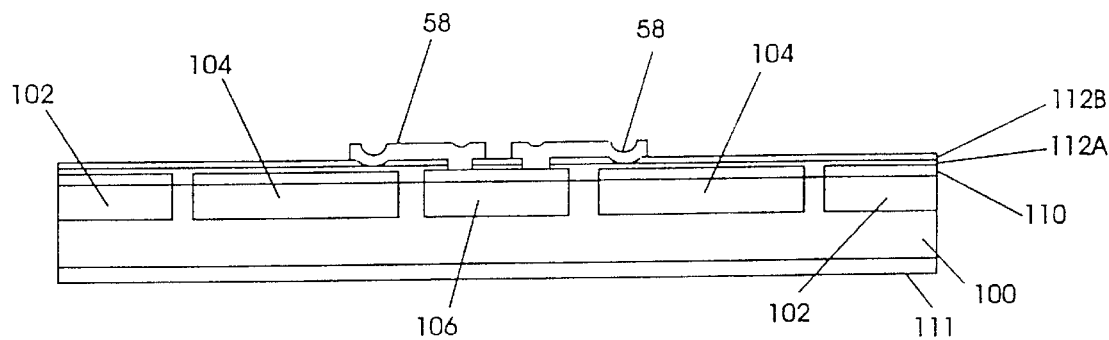
FIG. 3B is a cross sectional view of the substrate of FIG. 3A taken along the section line labeled FIG. 3B.
Figure 3C:
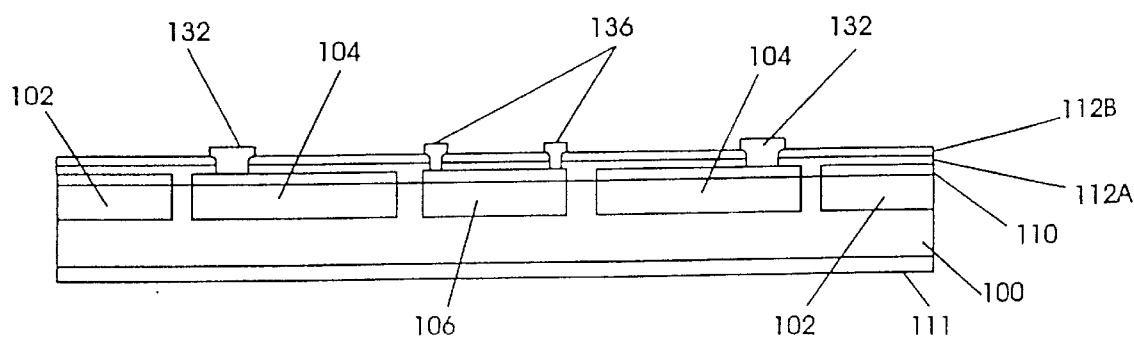
FIG. 3C is a cross sectional view of the substrate of FIG. 3A taken along the section line labeled FIG. 3C.

A polysilicon layer is formed on the patterned sacrificial layer 112 and patterned to form the beams which define the axes of rotation and to form the anchoring structures for the actuator electrodes and arms, as shown in FIGS. 3A–C. In particular, each of the beams 56 fills a respective hole 114 fixedly connecting it to the second frame region of the substrate and extends to the respective partial hole 126 thus forming the arched contact surface spaced from the first frame region of the substrate. Each of the beams 58 fills a respective hole 116 fixedly connecting it to the plate region of the substrate and extends to the respective partial hole 128 thus forming the arched contact surface spaced from the second frame region of the substrate.

The anchoring structures 130, 132, 134, and 136 are also formed from this patterned layer of polysilicon. Anchoring structures 130 are used to anchor the electrodes of the first set of actuators to the first frame region of the substrate, and anchoring structures 132 are used to anchor the electrodes from the second set of actuators to the second frame portion of the substrate. Anchoring structures 134 are used to anchor the arms from the first set of actuators to the second frame region of the substrate, and anchoring structures 136 are used to anchor the arms from the second set of actuators to the plate region of the substrate. As discussed above, the relatively large L shaped anchoring structures 130 and 132 can be used to provide relatively stiff actuators. Alternately, only the linear portions of the anchoring structures 130 and 132 perpendicular to the respective axes of rotation can be used to provide a more flexible actuator. Again, the dashed lines of FIG. 3A indicate the defined portions of the substrate which have been covered by the sacrificial layer 112.

Figure 4A:
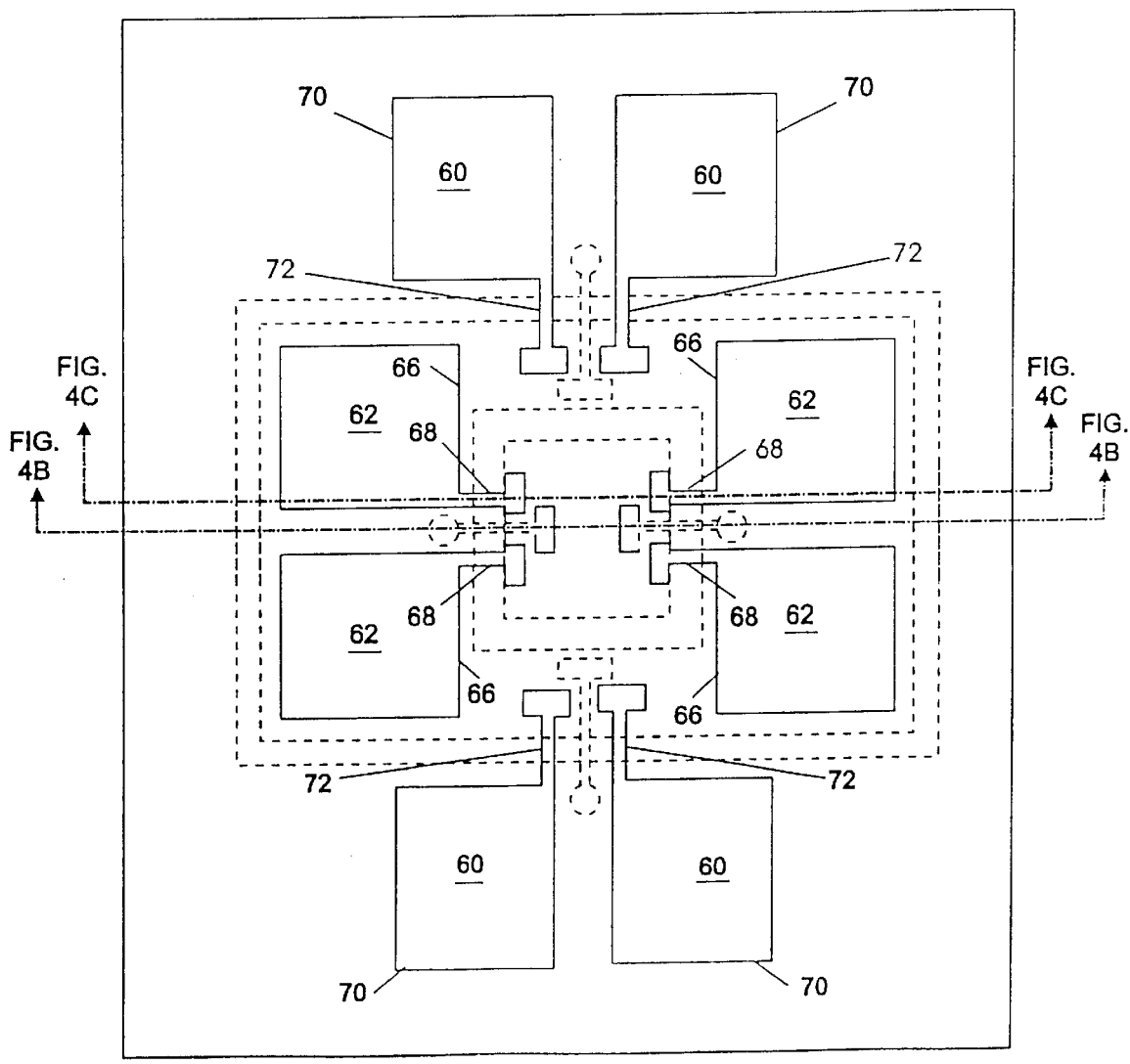
FIG. 4A is a plan view of the substrate of FIG. 3A with electrostatic actuators formed thereon.
Figure 4B:
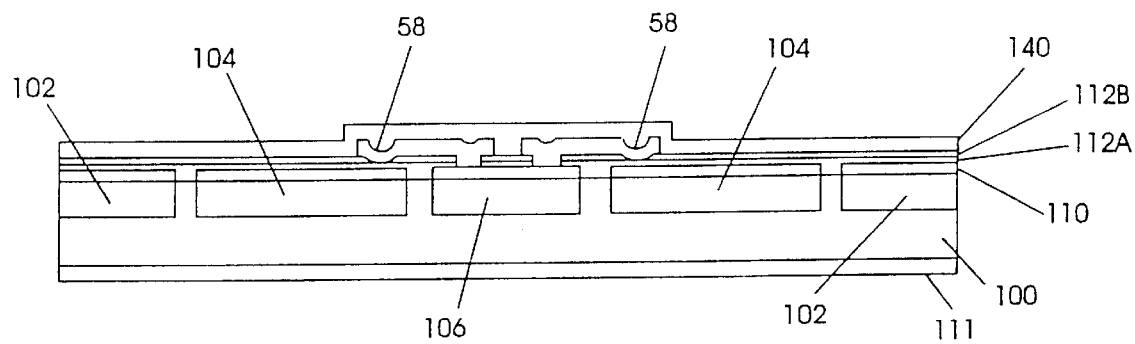
FIG. 4B is a cross sectional view of the substrate of FIG. 4A taken along the section line labeled FIG. 4B.
Figure 4C:
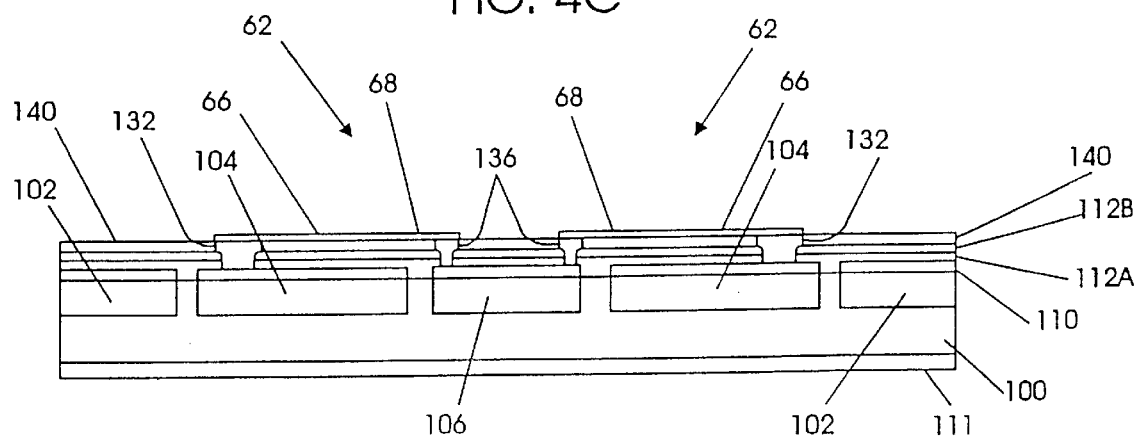
FIG. 4C is a cross sectional view of the substrate of FIG. 4A taken along the section line labeled FIG. 4C.

A second sacrificial layer 140 is then formed on the structure of FIGS. 3A–C and patterned, and a second patterned polysilicon layer is formed thereon as shown in FIGS. 4A–C. The second sacrificial layer 140 is patterned to expose the anchoring structures 130, 132, 134, and 136 shown in FIGS. 3A–3C. Because the polysilicon beams 56 and 58 are covered by the second polysilicon layer 140, these beams are illustrated with dotted lines in FIG. 4A. As before, the defined regions of the substrate are also illustrated with dotted lines.

The second patterned polysilicon layer forms the actuators 60 including electrodes 70 and arms 72, and the actuators 62 including electrodes 66 and arms 68. The second patterned polysilicon layer can be heavily doped so that the electrode portion of the actuator is conductive. As shown in FIGS. 4B and 4C, the actuators 60 and 62 are formed on the respective anchoring structures 130, 134, 132, and 136 which are exposed by the second sacrificial layer. By forming the beams 56 and 58 from the first polysilicon layer, and forming the actuators 60 and 62 from the second polysilicon layer, the beams can have a thickness that is different from that of the actuators. Preferably, the first polysilicon layer is relatively thick so that the beams 56 and 58 are stiff, and the second polysilicon layer is relatively thin so that the electrodes of the actuators are relatively flexible. For example, the beams can be formed from a polysilicon layer on the order of several microns thick, and the electrodes can be formed from polysilicon on the order of less than one micron thick. Alternately, the beams and the electrodes can be formed from the same polysilicon layer thus eliminating the need to form and pattern the second sacrificial layer and the second polysilicon layer.

The spacing between the actuator electrode and the substrate is determined by the combined thicknesses of the sacrificial layers. Accordingly, this spacing can be precisely controlled, and very small spacings can be provided.

The sacrificial layers and the sacrificial portions of the substrate are then selectively removed to form the microelectromechanical rotating mirror shown in FIGS. 5A–C. The backside nitride layer 111 is patterned to provide a mask for etching the substrate 100 using an etchant such as KOH to remove the undoped and unmasked portions of the substrate. Accordingly, the second frame region 104 is separated from the first frame region 102, and the plate region 106 is separated from the second frame region 104, thus forming the first frame 50, the second frame 52, and the plate 54. The sacrificial layers 112 and 140 are then selectively removed using an etchant such as HF to free the cantilevered actuator arms and support beams. As shown, the second frame 52 is suspended relative to the first frame 50 by the actuators 60. The plate 54 is suspended relative to the second frame 52 by the actuators 62.

The beams 58 thus include arched contact surfaces 64 adjacent the second frame 52 so that each beam is in rotational contact with the second frame. As shown, when none of the actuators is activated, the contact surfaces of both of the beams can be slightly spaced from the second frame 52. When force is applied to the plate by one or more of the actuators 62, the contact surface comes into contact with the second frame forcing the plate to then rotate about the axis defined by the beams. Accordingly, the beam rolls relative to the frame reducing the torque required to rotate the plate. The beam is thus defined as being in rotational contact with the frame even though a narrow space may exist between the contact surface of the beam and the frame when no force is applied to the plate.

By anchoring the arms 68 of the actuators 62 relatively close to the axis defined by the beams 58, a relatively small movement of the arm will result in a relatively large rotation of the plate. Accordingly, the electrodes of the actuators can be closely spaced from the second frame thus increasing the electrostatic force generated thereby while still effecting a significant rotation of the plate.

While the actuators are illustrated with the rotating beams, the actuator can alternately be used with other means for defining the axis of rotation. For example, the actuator can be used with torsion bars and/or a supporting ridge. Conversely, while the rotating beams are illustrated with the electrostatic actuators, the rotating beams can be used with other actuators. For example, the rotating beams can be used together with thermal actuators, magnetic actuators, piezoelectric actuators, and bimetallic actuators.

The plate 54 can serve as the mirror. If the substrate is a polished single crystal semiconductor material, a mirror finish can be provided by removing a portion of the nitride layer therefrom. Alternately, a layer 107 of a reflective material such as a metal can be formed on the plate. According to yet another alternative, the plate can be formed from the first polysilicon layer used to form the beams and polished or otherwise provided with a reflective layer thereon. The plate and the beams can thus be formed as an integrated structure.

Electrical connections on each of the first frame, the second frame, and the plate can be provided by conductive lines thereon. For example, metal lines or doped polysilicon lines can provide interconnection, and these lines can be insulated from the doped silicon by the nitride layer 110. Electrical connection between the first and second frames can be provided by wire bonding, through electrical connection across the beams 56, through electrical connection across the actuator arms 72, or through electrical connection across a long flexible bridge structure between the first and second frames.

The microelectromechanical rotating mirror of FIGS. 5A–C can thus be formed on a single substrate without the need to bond wafers or assemble discrete components. Accordingly, this mirror can be economically and reliably fabricated. Furthermore, the mirror provides independent rotation about two axes, and the electrodes do not lie in the path of rotations of the mirror.

By using a doping technique to define the frame and plate regions of the substrate, subsequent processing can be performed on a smooth substrate. The subsequent processes can be performed more easily due to the reduction in topography. Significant topography is added to the structure only after the final etches removing the sacrificial layers and substrate regions which occur after most processes which are sensitive to extreme topography have been completed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electromechanical device comprising:
   a first frame having a first aperture therein;
   a second frame suspended in said first aperture, said second frame having a second aperture therein;
   a plate suspended in said second aperture;
   a first pair of beams which support said second frame along a first axis relative to said first frame so that said second frame rotates about said first axis relative to said first frame and a second pair of beams which support said plate along a second axis relative to said second frame so that said plate rotates about said second axis relative to said second frame wherein said first axis and said second axis intersect, wherein at least one end of at least one of said beams comprises a rotational contact that minimizes torsional forces in said beam;
   a first actuator which provides mechanical force for rotating said second frame relative to said first frame about said first axis; and
   a second actuator which provides mechanical force for rotating said plate relative to said second frame about said second axis so that said plate can be independently rotated relative to said first axis and said second axis.

2. An electromechanical device according to claim 1 wherein said first and second frames respectively comprise first and second portions of a microelectronic substrate to provide a microelectromechanical actuator.

3. An electromechanical device according to claim 2 wherein said plate comprises a third portion of said microelectronic substrate.

4. An electromechanical device according to claim 2 wherein said microelectronic substrate comprises a silicon substrate and wherein said first and second pairs of beams comprise first and second polysilicon beams.

5. An electromechanical device according to claim 1 wherein each of said beams of said second pair extends from opposite sides of said plate to said second frame and wherein one end of each of said beams of said second pair is fixedly connected to one of said plate and said second frame and another end of each of said beams of said second pair is in rotational contact with the other of said plate and said second frame so that said plate rotates relative to said second frame about an axis defined by said beams of said second pair.

6. An electromechanical device according to claim 1 wherein each of said beams of said second pair is fixedly connected to said plate and wherein each of said beams of said second pair comprises an arched contact surface adjacent said second frame so that each of said beams of said second pair rolls on said second frame.

7. An electromechanical device according to claim 1 further comprising a biasing support which supports said plate relative to said second frame so that said plate and said second frame are coplanar when no mechanical force is provided by said second actuator and so that said plate rotates about said second axis when mechanical force is provided by said second actuator.

8. An electromechanical device according to claim 1 wherein said second actuator comprises an electrode spaced apart from said second frame and an arm extending from said electrode to a portion of said plate off said second axis wherein a potential difference between said electrode and said second frame results in an electrostatic force which is transmitted via said arm to said plate thus rotating said plate relative to said second frame.

9. An electromechanical device according to claim 8 wherein said electrode is fixedly connected to said second frame along a portion thereof spaced from said plate.

10. An electromechanical device according to claim 9 wherein said arm is fixedly connected to said plate so that said plate and said second frame are maintained in a common plane when there is no potential difference between said electrode and said second frame.

11. An electromechanical device according to claim 8 further comprising an insulating layer between said second frame and said electrode to prevent electrical shorts therebetween.

12. An electromechanical device according to claim 8 wherein said second actuator further comprises a second electrode spaced apart from said second frame and a second arm extending from said second electrode to a second portion of said plate opposite said second axis from said first arm wherein a potential difference between said second electrode and said second frame results in an electrostatic force which is transmitted via said second arm to said plate thus rotating said plate in a direction opposite rotation generated by said first actuator.

13. An electromechanical device according to claim 8 wherein said arm extends to a portion of said plate closely spaced from said second axis.

14. An electromechanical device comprising:
   a frame having an aperture therein;
   a plate suspended in said aperture;
   a pair of beams on opposite sides of said plate which define an axis of rotation through said plate about which said plate rotates relative to said frame, wherein each of said beams extends from said plate to said frame and wherein a first end of one of said beams is fixedly connected to one of said plate and said frame and a second end of one of said beams is in rotational contact with the other of said plate and said frame and minimizes torsional forces in said beam so that said plate rotates relative to said frame.

15. An electromechanical device according to claim 14 wherein each of said beams is fixedly connected to said plate.

16. An electromechanical device according to claim 14 wherein each of said beams comprises an arched contact surface on said beam adjacent said frame so that said beam rotates on said frame.

17. An electromechanical device according to claim 14 further comprising a biasing support which supports said plate relative to said frame so that said plate and said frame are generally coplanar when no mechanical force is provided to said plate and so that said plate rotates about said axis when mechanical force is provided to said plate.

18. An electromechanical device according to claim 14 wherein said frame comprises a portion of a microelectronic substrate.

19. An electromechanical device according to claim 18 wherein said plate comprises a second portion of said microelectronic substrate.

20. An electromechanical device according to claim 18 wherein said microelectronic substrate comprises a silicon substrate and wherein each of said beams comprises a polysilicon beam.

21. An electromechanical device according to claim 14 further including an actuator which provides mechanical force to rotate said plate relative to said frame about said axis.

22. An electromechanical device according to claim 21 wherein said actuator comprises an electrostatic actuator.

23. An electromechanical device according to claim 22 wherein said actuator comprises an electrode spaced apart from said frame and an arm extending from said electrode to a portion of said plate off said axis wherein a potential difference between said electrode and said frame results in an electrostatic force which is transmitted via said arm to said plate thus rotating said plate relative to said frame.

24. An electromechanical device according to claim 23 wherein said electrode is fixedly connected to said frame.

25. An electromechanical device according to claim 24 wherein said arm is fixedly connected to said plate so that said plate and said frame are maintained in a generally common plane when there is no potential difference between said electrode and said frame.

26. An electromechanical device according to claim 22 further comprising an insulating layer between said frame and said electrode to prevent electrical shorts therebetween.

27. An electromechanical device according to claim 22 wherein said arm extends to a portion of said plate closely spaced from said axis.

28. An electromechanical device comprising:
a frame having an aperture therein;
a plate suspended in said aperture;
a structure which supports said plate along an axis relative to said frame so that said plate rotates about said axis relative to said frame; and
an electrostatic actuator comprising an electrode spaced apart from said frame and an arm extending from said electrode to a portion of said plate off said axis wherein a potential difference between said electrode and said frame results in an electrostatic force which is transmitted via said arm to said plate thus rotating said plate relative to said frame.

29. An electromechanical device according to claim 28 wherein said electrode is fixedly connected to said frame along a portion thereof spaced from said plate.

30. An electromechanical device according to claim 28 wherein said arm is fixedly connected to said plate so that said plate and said frame are maintained in a common plane when there is no potential difference between said electrode and said frame.

31. An electromechanical device according to claim 28 further comprising an insulating layer between said frame and said electrode to prevent electrical shorts therebetween.

32. An electromechanical device according to claim 28 further comprising a second electrostatic actuator comprising a second electrode spaced apart from said frame and a second arm extending from said second electrode to a second portion of said plate opposite said axis from said first arm wherein a potential difference between said second electrode and said frame results in an electrostatic force which is transmitted via said second arm to said plate thus rotating said plate in a direction opposite rotation generated by said first actuator.

33. An electromechanical device according to claim 28 wherein said arm extends to a portion of said plate closely spaced from said axis.

34. An electromechanical device according to claim 28 wherein said frame comprises a portion of a microelectronic substrate to provide a microelectromechanical actuator.

35. An electromechanical device according to claim 34 wherein said plate comprises a second portion of said microelectronic substrate.

36. An electromechanical device according to claim 34 wherein said microelectronic substrate comprises a silicon substrate and wherein said electrode comprises a polysilicon layer.

37. An electromechanical device according to claim 28 wherein said structure comprises a pair of beams extending from opposite sides of said plate to said frame along said axis and wherein a first end of each of said beams is fixedly connected to one of said plate and said frame and a second end of each of said beams is in rotational contact with the other of said plate and said frame so that said plate rotates relative to said frame about an axis defined by said beams.

38. An electromechanical device according to claim 37 wherein each of said beams is fixedly connected to said plate and wherein each of said beams comprises an arched contact surface adjacent said frame so that said beam rolls on said frame.

39. A method for fabricating an electromechanical device on a substrate, said method comprising the steps of:
defining a plate region on a face of said substrate;
defining a frame region on said face of said substrate, wherein said frame region surrounds said plate region and wherein said plate region and said frame region are separated by a sacrificial substrate region;
forming a structure which supports said plate region and provides rotational connections with minimized torsional forces between said plate region and said frame region, allowing rotation of said plate region along an axis relative to said frame region;
forming an actuator on said face of said substrate which provides mechanical force to said plate region; and
removing said sacrificial substrate region so that said plate region rotates about said axis relative to said frame region responsive to mechanical force provided by said actuator.

40. A method according to claim 39 wherein said steps of defining said plate region and defining said frame region each comprise doping said respective regions, and wherein said step of removing said sacrificial substrate region comprises etching undoped portions of said substrate.

41. A method according to claim 39 wherein said step of forming a structure which supports said plate region comprises the step of forming a pair of beams on opposite sides of said plate region which define an axis of rotation through said plate region, wherein each of said beams extends from said plate region to said frame region and wherein each of said beams is fixedly connected to one of said plate region and said frame region and a second end of each of said beams is in rotational contact with the other of said plate region and said frame region so that said plate rotates relative to said frame.

42. A method according to claim 41 wherein said step of forming said pair of beams comprises the steps of:

forming a sacrificial layer on said substrate;

forming first and second holes in said sacrificial layer exposing portions of said plate region along said axis;

forming said first and second beams on said sacrificial layer wherein each of said beams is fixedly connected to said plate region through a respective one of said holes in said sacrificial layer; and removing said sacrificial layer.

43. A method according to claim 41 wherein said step of forming said first and second beams is preceded by the step of forming first and second partial holes in said sacrificial layer opposite said frame region without exposing said frame region, wherein said partial holes are formed along said axis, and wherein each of said first and second beams extends from a respective exposed portion of said plate region to a respective partial hole opposite said frame region.

44. A method according to claim 43 wherein said step of forming said partial holes comprises isotropically etching said sacrificial layer.

45. A method according to claim 43 wherein each of said partial holes has an arched surface so that each of said beams extending into said respective partial hole forms an arched contact surface.

46. A method according to claim 43 wherein said step of forming said sacrificial layer comprises the steps of forming a first sacrificial sublayer having a first etch rate on said substrate and forming a second sacrificial sublayer having a second etch rate which is high relative to said first etch rate on said first sacrificial sublayer opposite said substrate, and wherein said step of forming said partial holes comprises etching said second sacrificial sublayer.

47. A method according to claim 39 further comprising the step of forming a biasing support which supports said plate region relative to said frame region so that said plate region and said frame region are coplanar when no mechanical force is provided by said actuator and so that said plate region rotates about said axis when mechanical force is provided by said actuator.

48. A method according to claim 39 wherein said step of forming said actuator comprises forming an electrode spaced apart from said frame region and an arm extending from said electrode to a portion of said plate region off said axis wherein a potential difference between said electrode and said frame region results in an electrostatic force which is transmitted via said arm to said plate region thus rotating said plate region relative to said frame region.

49. A method for fabricating an electromechanical device, said method comprising the steps of:

forming a frame having an aperture therein;

forming a plate suspended in said aperture;

forming a pair of beams on opposite sides of said plate which define an axis of rotation through said plate about which said plate rotates relative to said frame, wherein each of said beams extends from said plate to said frame and wherein a first end of each of said beams is fixedly connected to one of said plate and said frame and a second end of each of said beams is in rotational contact with the other of said plate and said frame so that said plate rotates relative to said frame; and forming an actuator which provides mechanical force for rotating said plate relative to said frame about said axis.

50. A method according to claim 49 further comprising the step of forming a biasing support which supports said plate relative to said frame so that said plate and said frame are coplanar when no mechanical force is provided by said actuator and so that said plate rotates about said axis when mechanical force is provided by said actuator.

51. A method according to claim 49 wherein said step of forming said frame comprises forming said frame from a microelectronic substrate to provide a microelectromechanical actuator.

52. A method according to claim 51 wherein said plate is formed from said microelectronic substrate.

53. A method according to claim 51 wherein said microelectronic substrate comprises a silicon substrate and wherein each of said beams comprises a polysilicon beam.

54. A method according to claim 49 wherein said step of forming said actuator comprises forming an electrode spaced apart from said frame and an arm extending from said electrode to a portion of said plate off said axis wherein a potential difference between said electrode and said frame results in an electrostatic force which is transmitted via said arm to said plate thus rotating said plate relative to said frame.

55. A method according to claim 54 further comprising the step of forming an insulating layer between said frame and said electrode to prevent electrical shorts therebetween.

56. A method for fabricating a microelectromechanical device, said method comprising the steps of:

forming a frame having an aperture therein;

forming a plate suspended in said aperture;

forming a structure which supports said plate along an axis relative to said frame so that said plate rotates about said axis relative to said frame; and forming an electrostatic actuator comprising an electrode spaced apart from said frame and an arm extending from said electrode to a portion of said plate off said axis wherein a potential difference between said electrode and said frame results in an electrostatic force which is transmitted via said arm to said plate thus rotating said plate relative to said frame.

57. A method according to claim 56 wherein said arm is fixedly connected to said plate so that said plate and said frame are maintained in a common plane when there is no potential difference between said electrode and said frame.

58. A method according to claim 56 further comprising the step of forming an insulating layer between said frame and said electrode to prevent electrical shorts therebetween.

59. A method according to claim 56 further comprising the step of forming a second electrode spaced apart from said frame and a second arm extending from said second electrode to a second portion of said plate opposite said axis from said first arm wherein a potential difference between said second electrode and said frame results in an electrostatic force which is transmitted via said second arm to said plate thus rotating said plate in a direction opposite rotation generated by said first actuator.

60. A method according to claim 56 wherein said step of forming said frame comprises forming said frame from a microelectronic substrate to provide a microelectromechanical actuator.

61. A method according to claim 60 wherein said plate and said frame are formed from said microelectronic substrate.

62. A method according to claim 60 wherein said microelectronic substrate comprises a silicon substrate and wherein said electrode comprises a polysilicon layer.

63. A method according to claim 56 wherein said step of forming said structure comprises forming a pair of beams extending from opposite sides of said plate to said frame along said axis and wherein a first end of each of said beams is fixedly connected to one of said plate and said frame and a second end of each of said beams is in rotational contact with the other of said plate and said frame so that said plate rotates relative to said frame about an axis defined by said beams.

* * * * *